Figure 1:
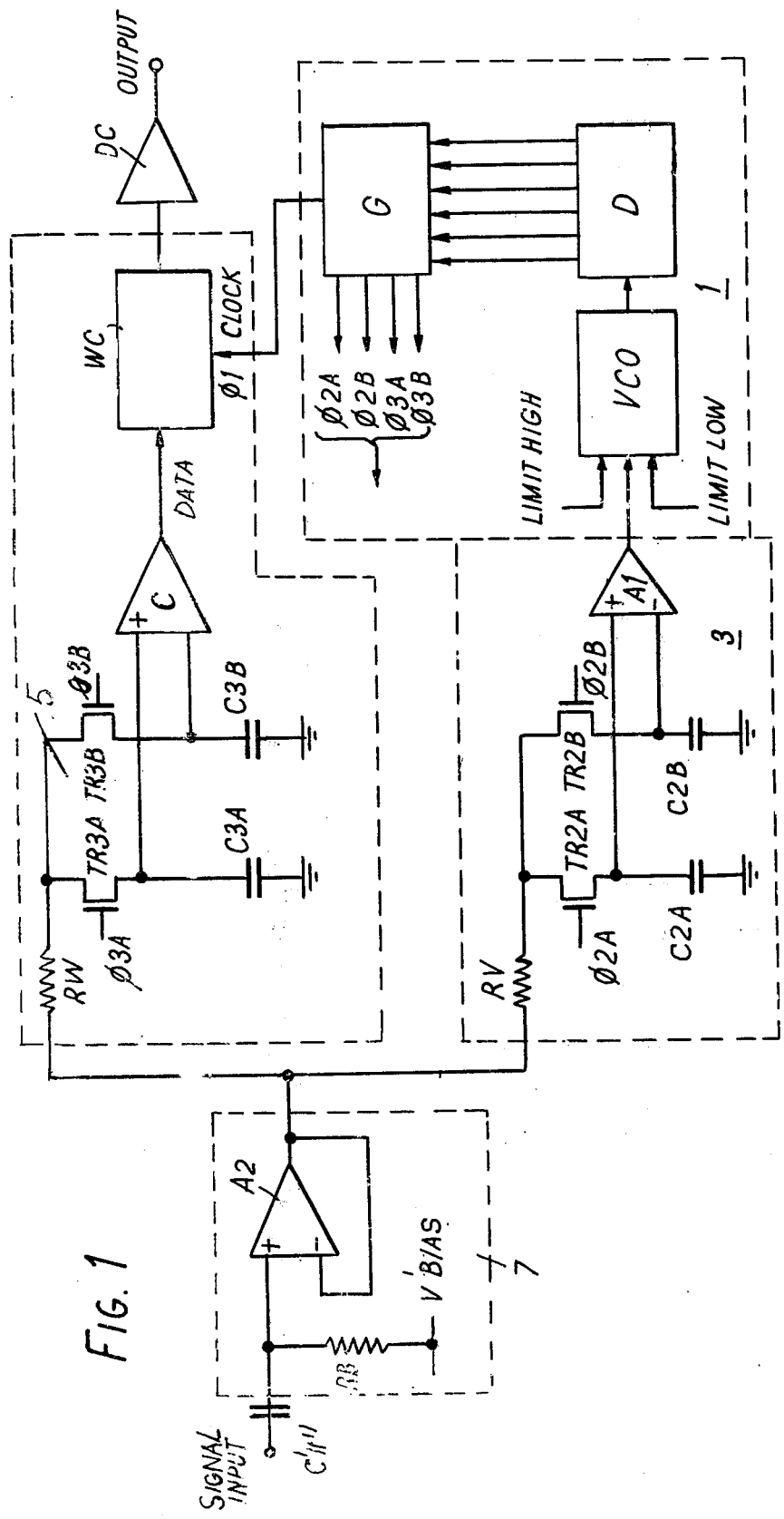

United States Patent [19]

Gurry

[11] 4,024,414
[45] May 17, 1977

[54] ELECTRICAL CIRCUIT MEANS FOR DETECTING THE FREQUENCY OF INPUT SIGNALS

[75] Inventor: George W. Gurry, Witham, England

[73] Assignee: Bertram Frederick McCarthy, Witham, England

[22] Filed: May 10, 1976

[21] Appl. No.: 684,898

Related U.S. Application Data

[63] Continuation of Ser. No. 519,741, Oct. 31, 1974, abandoned.

[30] Foreign Application Priority Data

Oct. 31, 1973 United Kingdom ............ 50666/73

[52] U.S. Cl. ........................... 307/233 R; 307/232; 328/136; 328/138; 328/140; 328/151
[51] Int. Cl.² ........................................ H03K 5/20
[58] Field of Search ........... 307/233, 232; 328/138, 328/136, 140, 151

[56] References Cited

UNITED STATES PATENTS

| 3,214,700 | 10/1965 | Hook | 328/151 |
| 3,480,795 | 11/1969 | Benson et al. | 328/151 X |
| 3,493,874 | 2/1970 | Finkel et al. | 328/151 |
| 3,723,771 | 3/1973 | McLean | 307/233 |
| 3,786,358 | 1/1974 | Fiorino | 307/233 |
| 3,866,133 | 2/1975 | Hogue et al. | 307/233 |
| 3,882,545 | 5/1975 | Titus | 307/233 |

Primary Examiner—Saxfield Chatmon, Jr.
Attorney, Agent, or Firm—Browdy and Neimark

[57] ABSTRACT

A device for detecting input signals whose frequency lies within a predetermined range of frequencies. Included in the device is an oscillator and two sampling circuits which are operated by switching signals derived from the oscillator. An input signal of unknown frequency is applied to a first sampling circuit, an "oscillator sampling circuit" which generates a control voltage if the frequency of the input signal is within the range. The control voltage is applied to the oscillator and causes the frequency of the switching signals to become equal to a multiple of the frequency of the input signal. Further switching signals, also having a frequency equal to a multiple of the frequency of the input signal, are applied to the second sampling circuit, the "word sampling circuit", which also receives the input signal. The word sampling circuit then provides an output if the amplitude of the input signal is above a predetermined threshold value.

19 Claims, 2 Drawing Figures

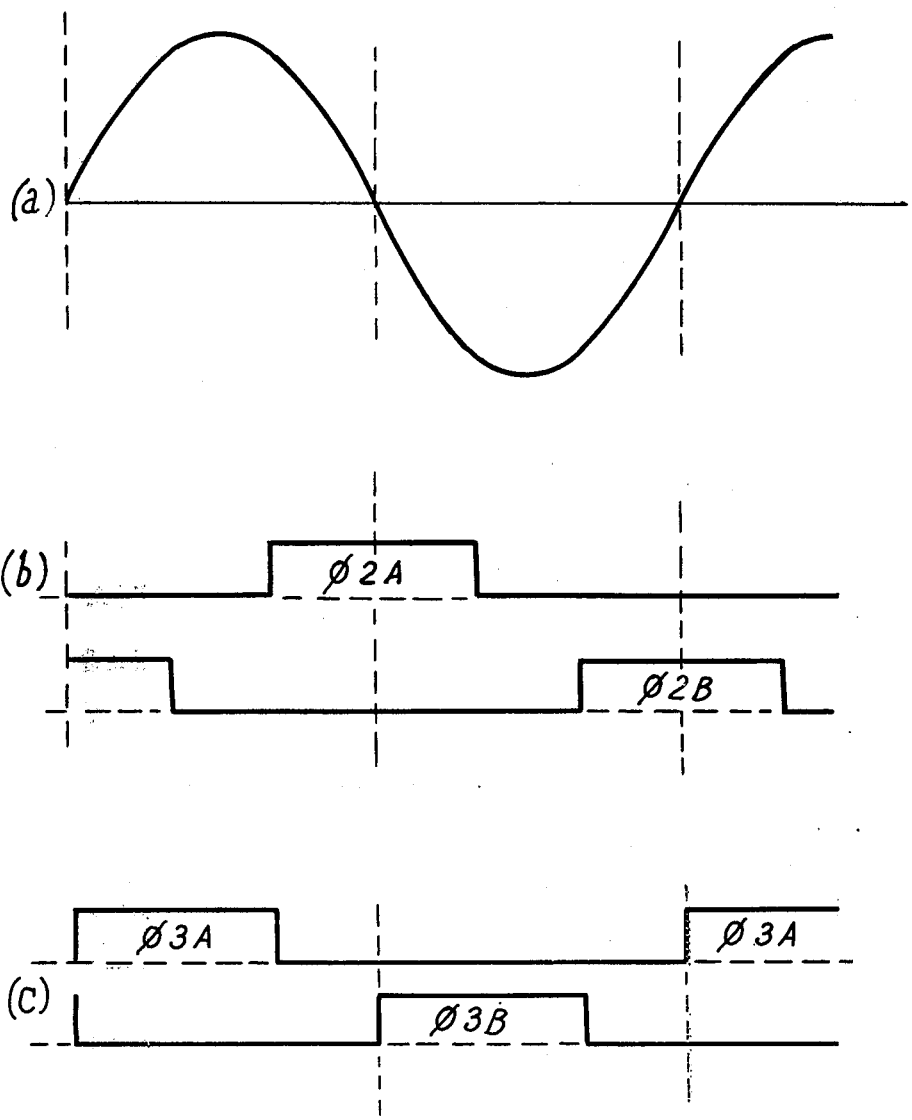

ELECTRICAL CIRCUIT MEANS FOR DETECTING THE FREQUENCY OF INPUT SIGNALS

This is a continuation, of application Ser. No. 519,741, Oct. 31, 1974 now abandoned.

This invention relates to electrical circuit means for detecting input signals having a frequency within a predetermined range of frequencies.

According to the invention electrical circuit means for detecting input signals having a frequency within a predetermined range of frequencies comprise first and second sampling means each having an input for connection to a source of the input signals and a switching input, oscillator means having a control input and first and second output means at which the oscillator means are adapted, in use, to generate respective first and second switching signals, means coupling the first and second output means of the oscillator means to the switching inputs of respective first and second sampling means, whereby the switching signals cause respective first and second sampling means to operate and admit the input signal thereto for respective first and second sampling periods, the frequency of the first sampling periods having a predetermined relationship with a frequency in the predetermined range and the first sampling means being adapted, in operation, to generate a control signal representing a difference between the said frequency in the predetermined range and the frequency of the input signal and/or a departure from a predetermined phase relationship between the first sampling periods and the input signal, and means for applying the control signal to the control input of the oscillator means, the application to the oscillator means of a control signal representing an input signal having a frequency within the predetermined range causing a change in the first switching signals so that the first sampling periods are brought into the predetermined frequency and phase relationship with the input signal and a change in the second switching signals so that the second sampling periods are brought into a further predetermined frequency and phase relationship with the input signal, and the second sampling means being adapted, when the second sampling periods have the said further predetermined frequency and phase relationship with the input signal and when the magnitude of the input signal is above a predetermined value, to generate an output signal representing detection of the said input signal.

Preferably, the frequency of the first sampling periods is initially equal to twice the said frequency in the predetermined range but can be varied over a range whose upper and lower frequencies are respectively equal to twice the upper and lower frequencies in the predetermined range and each of the first sampling periods extends over an interval of time which, when the frequency of the first sampling periods has been caused to change to a value equal to twice the frequency of the input signal, is centred on an instant of time at or near the instant at which the polarity of the input signal changes. Each of the first sampling periods preferably extends over an interval of time which is twice as long as the interval of time between successive first sampling periods.

Preferably, the second sampling periods also have a frequency which is initially equal to twice the said frequency in the predetermined range but can be varied over a range whose upper and lower frequencies are respectively equal to twice the upper and lower frequencies in the predetermined range. Each of the second sampling periods preferably extends over an interval of time which is twice as long as the interval of time between successive second sampling periods. Preferably, each of the second sampling periods begins and ends within a single half cycle of the input signal when the frequency of the second sampling periods has been caused to change to a value equal to twice the frequency of the input signal. Suitably, each of the second sampling periods commences at the instant at which the polarity of the input signal changes sign.

The invention will now be described, by way of example, with reference to the accompanying drawings, in which:

FIG. 1 is a block diagram of electrical circuit means according to the invention; and FIG. 2 shows an input signal locked in frequency and phase to the frequency and phase of an oscillator in the circuit means of FIG. 1 and switching signals generated in those circuit means.

The electrical circuit means of FIG. 1 is a device for detecting input signals whose frequency lies within a predetermined narrow range of frequencies. The device is designed to be insensitive to high levels of noise or other signals outside the range, particularly harmonics of the predetermined frequency.

The present device includes an oscillator circuit 1 and two sampling circuits 3 and 5, respectively, which are operated by switching signals derived from the oscillator circuit. An input signal of unknown frequency is applied to a first of the two sampling circuits, an "oscillator sampling circuit" 3, and this circuit generates a control voltage if the frequency of the input signal is within the above mentioned range. The control voltage is applied to the oscillator 1 and serves to cause the frequency of the switching signals to be maintained at, or change to, a frequency which is a multiple of the frequency of the input signal. Further switching signals, also generated at a frequency equal to a multiple of the frequency of the input signal, are applied to the second sampling circuit, the "word sampling circuit" 5, which also receives the input signal. The word sampling circuit 5 then provides an output signal representative of the detection of an input to which the switching signals have been locked in frequency and phase and which has an amplitude above a predetermined threshold value.

Referring to FIG. 1, the oscillator sampling circuit 3 includes a pair of capacitors C2A and C2B and a pair of MOS switching transistors TR2A and TR2B respectively associated with capacitors C2A and C2B. Each capacitor C2A, C2B is connected between earth potential and a source electrode of the associated transistor TR2A, TR2B. The drain electrode of each transistor is connected to a resistor RV of the sampling circuit 3 and resistor RV is in turn connected via a biasing circuit 7, hereinafter described, and an input capacitor $C_{IN}$ to a source of input signals.

The junction between each capacitor C2A, C2B and the associated transistor TR2A, TR2B is connected to an associated input terminal of a differential amplifier A1. An output terminal of the amplifier A1 is connected to a control terminal of the oscillator circuit 1.

The oscillator circuit 1 is made up of a voltage controlled oscillator Vco, divider circuits D and gating circuits G.

Oscillator Vco is a free-running oscillator which generates electrical oscillations at a frequency determined by a ramp voltage generated within the oscillator. Variation of the frequency of these oscillations can be effected by varying the magnitude of the ramp voltage by means of a control voltage applied to the oscillator circuit from the differential aamplifier A1. Variation of the frequency of the oscillations is restricted to a range whose upper and lower limits are six times the respective upper and lower limits of the predetermined range.

The divider circuits D have an input coupled to the output of the oscillator Vco and six outputs. They are adapted, when supplied with oscillations from the oscillator Vco, to generate a series of pulses, each pulse in the series having a duration equal to the period of the oscillations from the oscillator Vco and succeeding pulses occupying immediately succeeding intervals of time and appearing at succeeding outputs of circuits D. Pulses from the divider circuits D are applied to the gating circuits G which provide two series of switching pulses at outputs thereof.

In a first of the two series of switching pulses there are pulses 02A and 02B which appear alternately at a first pair of outputs of the gating circuit G. These outputs are respectively connected to gate electrodes in the transistors TR2A and TR2B. Likewise, pulses 03A and 03B in a second series of switching pulses appear alternately at a second pair of outputs of the gating circuit. These outputs are connected to the word sampling circuit, as hereinafter described.

The word sampling circuit 5 has a pair of capacitors C3A and C3B which are each associated with a respective switching transistor TR3A and TR3B. As in the case of the capacitors in the oscillator sampling circuit 3, each capacitor C3A, C3B is connected between earth potential and a source electrode of the associated transistor TR3A, TR3B. The drain electrodes of transistors TR3A and TR3B are connected via a resistor RW, the above mentioned biasing circuit 7 and the input capacitor $C_{IN}$ to the source of unknown signals. The gate electrodes of transistors TR3A and TR3B are respectively connected to the second pair of outputs of the gating circuit G.

In the word sampling circuit 5 the junction between each capacitor C3A, C3B and the associated transistor TR3A, TR3B is connected to a respective input of a voltage comparator C. Comparator C has an output terminal which is switched from a "0" condition to a "1" condition when the difference between the voltages on respective inputs thereof exceeds a predetermined threshold value and has a predetermined sign.

In practice, the comparator C has two operating threshold values. First, a turn-on operating threshold value which, when reached by a differential input voltage, causes the output to be switched to the "1" condition. When this "1" condition is reached the threshold value is reduced to half the previous value. This gives equal turn-on and turn-off times when the input takes the form of a burst of signal.

The output of comparator C is connected to a data input of a word counter WC of the form disclosed in our Specification No. 1279611. The counter WC has a second input which is supplied with clocking pulses 01 from a fifth output of the gating circuits G and an output which is connected via driver circuits DC to a switch at the output of the device.

The biasing circuit 7, referred to above, includes a differential amplifier A2 having a first input which is directly connected to an output of the amplifier to provide 100% negative feedback and to give an overall gain of unity. The output of the differential amplifier A2 is also connected to the end of each resistor RV and RW remote from the capacitor C2A, C3A to which the resistor is connected.

A second input of the differential amplifier A2 in the biasing circuit 7 is connected to the above mentioned capacitor $C_{IN}$ and is also connected via a high valued biasing resistor RB to the midpoint of a resistor network (not shown). The network is connected between the negative terminal of a source of direct current and earth potential.

In use of the present device the biasing curcuit 7 presents a high input impedance to signals from the source, this impedance remaining constant irrespective of changes in voltage levels in the sampling circuits. The biasing circuit 7 also provides a predetermined bias level, V BIAS, equal to one half of the voltage from the direct current source, on each of the capacitors $C_{IN}$, C2A, C2B, C3A and C3B. Signals applied to these capacitors then cause deviations in voltage above and below the bias level.

When power is supplied to the various circuits of the present embodiment, and in the absence of any input signal, the voltage controlled oscillator Vco generates electrical oscillations at a frequency six times a frequency which is nominally midway between the upper and lower limits of the predetermined range referred to above. These oscillations are applied to the divider circuits D and result in the generation of the two series of switching pulses at respective pairs of outputs of the gating circuits G.

Referring to FIG. 2(b), each pulse in the first series of switching pulses 02A, 02B lasts for two cycles of the oscillations from oscillator Vco and is separated from the preceding pulse in the series by an interval of time equal to one cycle of the oscillations. Alternate pulses 02A and 02B are applied to respective transistors TR2A and TR2B and each pulse drives the gate electrode of the associated transistor negative with respect to the source electrode. This causes the transistor to conduct for the duration of the pulse. If the frequency of the input signals is equal to one sixth of the frequency of the oscillations from the oscillator Vco, as shown in FIG. 2(a), each switching pulse 02A, 02B lasts for an interval of time equal to a third of the period of the input signal. There is an interval of time between successive pulses which is equal to one sixth of the period of the input signal.

If each switching pulse 02A and 02B is centred on an instant at which the polarity of the input signal changes, transistor TR2A conducts for spaced intervals of time, each equal to one third of the period of the input signal and centred on a change in polarity of that signal from say, positive to negative polarity. Likewise, transistor TR2B conducts for spaced intervals of time, each equal to one-third of the period of the input signal and each centred on a change from negative to positive polarity.

During the first half of each switching pulse 02A applied to transistor TR2A a small positive charge flows into capacitor C2A via the transistor. During the second half of each switching pulse 02A, when the polarity of the voltage applied to the capacitor C2A is reversed, the positive charge is removed from the capacitor. There is therefore no net increase in charge on capacitor C2A as a result of the application of the switching pulses to transistor TR2A. Similarly, a small negative charge is built up on capacitor C2B during the first half of each switching pulse 02B applied to transistor TR2B, the charge is removed during the second half of each pulse, and there is no net gain in charge in the capacitor C2B.

As long as the input signal has the above mentioned frequency and phase relationships with the switching pulses derived from the oscillator Vco the voltages across capacitors C2A and C2B remain equal in magnitude to VB, the biasing voltage from the biasing circuit. These voltages VB are applied to respective inputs of the differential amplifier A1 and result in an output volatage from the amplifier which is also equal to VB. With this output voltage VB applied to the control input of the oscillator Vco the ramp voltage in the oscillator maintains the frequency of the oscillations at the mid-point of the predetermined range i.e., the oscillator frequency remains equal to six times the frequency of the input signal.

If the frequency of the input signals is below one sixth of the oscillator frequency but within the predetermined range the switching pulses 02A and 02B applied to transistors TR2A and TR2B vary in phase with respect to the input signal. There will be times when each switching pulse 02A is applied to transistor TR2A whilst the input signal is positive-going for longer than it is negative-going. At such times each switching pulse 02B is applied to transistor TR2B whilst the input signal is negative-going for longer than it is positive-going. In the result, the voltage on capacitor C2A becomes positive with respect to the voltage on capacitor C2B. There will be other, shorter times at which the voltage on capacitor C2A becomes negative with respect to the voltage on capacitor C2B. The net effect is that there is on average a more positive voltage on capacitor C2A than there is on capacitor C2B. This causes the output voltage from the differential amplifier A1 to become more positive, whereupon the ramp voltage of the oscillator Vco is raised and the frequency of the oscillations from the oscillator is lowered until it becomes equal to six times the frequency of the input signals. The time taken for the frequency of the oscillator Vco to reach this lower value is determined by the time constant of the integrating storage system RV, C2A and C2B.

It will be appreciated that an input signal of frequency above one sixth of the oscillator frequency, but within the predetermined range, results in a lower ouput voltage from the amplifier A1, a decrease in the ramp voltage in the oscillator Vco, and a corresponding increase in frequency of the oscillator.

If the frequency of the input signal is equal to one sixth of the frequency of the oscillations from oscillator Vco but the switching pulses are not centred at an instant when the polarity of the input signal changes sign the voltage on one of the capacitors C2A and C2B again becomes positive with respect to the other. This causes a change in the control voltage applied to the oscillator Vco and a change in the frequency of the oscillation from the oscillator. Such a change in frequency inevitably changes the phase between the switching pulses and the input signal, and the frequency change continues until there is the required phase relationship between the switching pulses and the input signal. At this point the control voltage applied to the oscillator Vco is returned to the value corresponding to a frequency of oscillations from oscillator Vco which is back at a value equal to six times the frequency of the input signal.

As mentioned above, upper and lower limits are imposed on the ramp voltage in the oscillator Vco. Accordingly, an input signal of frequency outside the predetermined range results in a control voltage from the amplifier A1 which is not able to move the ramp voltage outside the limits and cannot therefore bring the frequency of the oscillations to a value equal to six times that of the input signal.

Assuming now that the input signal has a frequency equal to the free-running frequency of the oscillator Vco, or that the frequency of the signal is sufficiently close to the free-running frequency for the oscillator frequency to be locked to the frequency of the input signal in the manner described above, the effect of the further switching pulses 03A and 03B applied to the word sampling circuit can be considered. As mentioned above and shown in FIG. 2(c), each of these further switching pulses has a duration equal to twice the period of the oscillations from oscillator Vco, and hence equal to one third of the period of the input signal. Each pulse is separated from the succeeding pulse by one sixth of the period of the input signal. The pulses 03A and 03B are applied to transistors TR3A and TR3B respectively.

During the interval of time that a switching pulse 03A or 03B is applied to a transistor TR3A or TR3B the transistor conducts and the input signal is applied to the associated capacitor C3A or C3B. The phase of the pulses 03A applied to transistor TR3A is such that the input signal has just moved from a negative to a positive polarity at the beginning of each pulse. The pulse then lasts for two thirds of the positive half cycle of the input signal. In the case of transistor TR3B, each pulse 03B begins at the beginning of a negative half cycle of the input signal and lasts for two thirds of that half cycle.

The result is that positive charge flows into capacitor C3A during a part of each positive half cycle of the input signal and negative charge flows into a capacitor C3B during part of each negative half cycle. Assuming that the frequency of the input signal remains equal to one sixth of the frequency of oscillations from oscillator Vco and that the phase of the switching pulses is as described above, a positive charge is built up on capacitor C3A and an equal negative charge is built up on capacitor C3B. The resulting voltages across the capacitors C3A and C3B are applied to respective inputs of the comparator C. When the voltage differential on the inputs has the correct sign and exceeds the predetermined threshold value, representative of an input signal of amplitude above a predetermined magnitude, the output of comparator C switches from a "0" condition to a "1" condition.

The output of comparator C is applied to a data input of word counter WC of the form disclosed in Specification No. 1279611.

As mentioned above, the counter WC has a clock input which receives clocking pulses 01 from the fifth output of the gating circuits G. Each clocking pulse 01 has a duration equal to the period of the oscillations from oscillator Vco and the repetition frequency of the pulses is one sixth of the frequency of the oscillator, i.e. equal to the frequency of the input signal. As described in Specification No. 1279611, the output of the counter WC only switches from a first state to a second state representing detection of a signal having a frequency within the predetermined range if the output of the comparator C is switched to the "1" condition and remains in that condition whilst the counter WC receives a predetermined number of consecutive clocking pulses 01. This prevents any transient input signal within the predetermined range from giving rise to an output signal to activate the driver circuits and the switch at the output of the device.

It will be appreciated that the integrating nature of the storage means in each sampling circuit renders the present circuit insensitive to high levels of noise and frequencies outside the range determined by the oscillator Vco.

The circuit is also insensitive to harmonics of frequencies within the detection range.

Thus, for an input signal having a frequency equal to twice one of the frequencies in the predetermined range each sampling pulse applied to the oscillator sampling circuit 3 extends over two-thirds of a cycle of the input signal. Accordingly, if there is a change in the frequency of the input signal this will cause the same polarity and magnitude of charge to be built up on each of the capacitors C2A and C2B. In other words, the voltages applied to respective inputs of the differential amplifier A1 remain equal in magnitude and phase and the output voltage applied to the oscillator Vco cannot change. There is therefore no effect on the frequency of the oscillations from the oscillator Vco and synchronism with the input signal is not maintained.

As regards the word sampling circuit 5, each sampling pulse applied to the circuit also begins at the same point in a cycle, the voltages applied to comparator C remain equal in magnitude and phase, and the output of the comparator is not switched to the "1" condition.

Similar considerations apply to any harmonic whose frequency is an even-numbered multiple of a frequency within the predetermined frequency range.

In the case of a third harmonic of a frequency within the predetermined range, each switching pulse applied to the oscillator and word sampling circuits 3 and 5 respectively, extends over one complete cycle of the input signal. There is therefore no net charge built up on any of the capacitors C2A, C2B, C3A and C3B and there is no change in the control voltage from the differential amplifier A1 or in the output of comparator C.

In the case of a fifth harmonic, the oscillator Vco can be locked to the input signal but the polarities of the charges on capacitors C3A and C3B are then the reverse of those required to give a "1" condition at the output of comparator C.

In the case of a seventh harmonic, there are voltages of the magnitude and sign to provide a control voltage from the differential amplifier A1 and the frequency of the oscillator Vco can therefore be locked on to the frequency of the input signal. There are also changes in the voltages from capacitors C3A and C3B in the word sampling circuit which are suitable in phase for switching the output of the comparator C. However, the amplitudes of the changes in voltage are reduced by 18dB relative to the changes brought about by an input signal within the predetermined frequency range and of similar amplitude.

The device shown in FIG. 1 can be vaired by varying the phase of each switching pulse applied to the word sampling circuit 5. Insensitivity of the device to harmonics is retained as long as each pulse begins and ends between the beginning and ending of a single half cycle of the input signal and as long as each pulse has a duration twice as long as the spacing between successive pulses.

As regards the switching pulses for the oscillator sampling circuit 3, sensitivity to harmonics may be tolerable even though the duration of the switching pulses is varied, as long as each pulse remains centred on a change in polarity of the input signal.

Thus, in one modification of the device shown in FIG. 1 the frequency of the oscillations from oscillator Vco are adjusted so that each switching pulse applied to the word sampling circuit has a duration equal to one third of a cycle of the input signal, for all input signals having a frequency within the predetermined range. Each pulse is centred on a maximum or minimum value of the input signal. As regards the oscillator sampling circuit, each switching pulse for this circuit occupies the time interval between two successive pulses for the word sampling circuit, i.e. the duration of the pulses for the oscillator sampling circuit is equal to one sixth of a cycle of the input signal.

This modified circuit is insensitive to input signals having a frequency equal to twice one of the frequencies in the predetermined range. An input signal which is a third harmonic of a frequency within the predetermined range does cause the frequency of the oscillator Vco to be locked on to the input signal. However, the polarities of the charges on the capacitors in the word sampling circuit assume an average value of zero and there is no change in the output from the comparator C. The effect of harmonics above the third harmonic can be removed by providing suitable high frequency attenuation at the input to the device.

With the circuit shown in FIG. 1 the net change in charge on capacitors C2A and C2B is very low and constant in value when the oscillator Vco is locked on to an input signal. There is, however, a temporary increase in the charge on each capacitor when a switching pulse is applied thereto and a decrease to zero in the charge during the interval between successive switching pulses. These temporary increases and decreases in charge may cause a fluctuation in the frequency of the oscillations from the oscillator Vco.

To avoid such fluctuations the output of the differential amplifier A1 may be coupled to the control input of the oscillator Vco via a switch and a storage capacitor provided between the control input and earth potential. The switch is operated by pulses from the divider circuits which cause the switch to close during the intervals between successive pulses 02A, 02B. In the result the capacitor is charged to a steady voltage which represents the difference between the charges on capacitors C2A and C2B during the intervals between switching pulses and is unaffected by temporary fluctuations in the charges.

In a further modification of the circuit of FIG. 1 a switch is provided at the input to the comparator C in the word sampling circuit. Associated with the switch are circuits for changing the threshold voltage of the comparator. The switch is operated by an output voltage supplied from the word counter when the output of the counter switches to a state representing detection of an input signal having a frequency within the predetermined frequency range. The effect of operating the switch is to change the threshold voltage to a value such that the output of the comparator will only change from the "1" condition back to the "0" condition if the charges on capacitors C3A and C3B fall to one half of their "turn-on" values. This prevents the output of the comparator from switching between the "0" and "1" conditions due to small movements of the voltages on capacitors C3A and C3B about the original threshold voltage.

What we claim is:

1. An electrical circuit for detecting input signals having a frequency which lies within a predetermined range of frequencies, the circuit comprising:

first sampling means having a first input means and a switching input means;

second sampling means having a first input means and a switching input means;

means for applying same input signals to each of said first input means of said first and second sampling means;

oscillator means having a control signal input means, first output means and second output means for generating in operation first switching signals at its said first output means and second switching signals at its said second output means, these first and second switching signals each having a given frequency which bears a predetermined relationship with a current input signal having a frequency within the predetermined range of frequencies;

means for applying the first switching signals from said oscillator means to said switching input means of said first sampling means, said first sampling means being responsive in operation to an input signal applied to said first input means thereof and the first switching signals applied to said switching input means thereof for admitting an input signal thereto for first sampling periods whose frequency has a predetermined relationship with the given frequency and is within the predetermined range of frequencies and for generating a control signal representing at least one of (1) a difference between the given frequency and frequency of the current input signal being received and (2) a departure from a predetermined phase relationship between the first sampling periods and the current input signal;

means for applying the control signal from said first sampling means to said control input means of said oscillator means, said oscillator means being responsive to a control signal representative of an input signal having a frequency within the predetermined range to cause first sampling periods of the first switching signals to have a predetermined frequency and phase relationship with the current input signal and for causing second sampling periods of the second switching signals to have a further predetermined frequency and phase relationship with the current input signal; and means for applying the second switching signals to said switching input means of said second sampling means, said second sampling means being responsive in operation to signals from said oscillator second output means establishing the second sampling periods having the further predetermined frequency and phase relationship to the current input signal and responsive to the input signal being above a predetermined value for generating an output signal from said second sampling means representing detection of an input signal within the predetermined range of frequencies.

2. An electrical circuit as claimed in claim 1, wherein said oscillator means comprises oscillator means for producing first switching signals having a frequency initially equal to twice the frequency of an input signal within the predetermined range and variable over a range whose upper and lower frequencies are respectively equal to twice the upper and lower frequencies of the predetermined range and for centering each of the first sampling periods, which extend over an interval of time when the frequency of the first sampling periods has been caused to change to a value equal to twice the frequency of the instant input signal, on an instant of time substantially at an instant at which polarity of the instant input signal changes.

3. An electrical circuit as claimed in claim 2, wherein said oscillator means comprises oscillator means for extending each of the first sampling periods over an interval of time which is twice as long as the interval of time between successive first sampling periods.

4. An electrical circuit as claimed in claim 3, wherein said oscillator means comprises oscillator means for establishing the second sampling period as having a frequency which is initially equal to twice the frequency in the predetermined range and variable over a range whose upper and lower frequencies are respectively equal to twice the upper and lower frequencies of the predetermined range.

5. An electrical circuit as claimed in claim 4, wherein said oscillator means comprises oscillator means for extending each of the second sampling periods over an interval of time which is twice as long as the interval of time between successive second sampling periods.

6. An electrical circuit as claimed in claim 5, wherein said oscillator means comprises oscillator means for beginning and ending of the second sampling periods within a single half cycle of the instant input signal whenever the frequency of the second sampling periods has been caused to change to a value equal to twice the frequency of the instant input signal.

7. An electrical circuit as claimed in claim 6, wherein said oscillator means comprises oscillator means for commencing each of the second sampling periods at the instant at which polarity of the instant input signal changes sign.

8. An electrical circuit as claimed in claim 1, wherein said first sampling means comprises integrating storage means and switch means through which, in operation, the input signal is applied to said storage means, the first switching signals from said oscillator means being applied to a switching input of said switch means for causing in response thereto the input signal to be applied to said storage means for the duration of each switching signal.

9. An electrical circuit as claimed in claim 8, wherein said storage means in said first sampling means includes capacitor means upon which a charge representative of a difference in frequency and phase between the switching signals and the instant input signal is built up.

10. An electrical circuit as claimed in claim 9, wherein said integrating storage means comprises a resistor and capacitors to which the input signal is applied alternately.

11. An electrical circuit as claimed in claim 1, further including a differential amplifier, wherein said first sampling means comprises a resistor, two capacitors, and switch means through which the input signal is applied alternately to respective capacitors, and wherein each of said capacitors is connected to a respective input of said differential amplifier, said amplifier generating a control voltage which is applied to said oscillator means and causes a change in frequency of the first switching signals to a value at which each first sampling period is centered substantially at an instant of time at which polarity of the instant input signal changes, the charges on said capacitors being equal to each other.

12. An electrical circuit as claimed in claim 11, further including a switch, wherein output of said differential amplifier is coupled to said oxcillator means via said switch, a switching signal being applied to said switch from said oscillator means for closing the switch only during intervals between the first sampling periods, and capacitor means provided at input connection to said oscillator means for providing the control voltage to said oscillator means which is unaffected by temporary fluctuations in charges on said two capacitors.

13. An electrical circuit as claimed in claim 1, wherein said second sampling means comprises integrating storage means and switch means through which the input signal is applied to said storage means, the second switching signals from said oscillator means being applied to a switching input of said switch means for causing the input signal to be applied to said storage means for the duration of each second switching signal.

14. An electrical circuit as claimed in claim 13, wherein said integrating storage means in the second sampling means includes capacitor means upon which charge representative of magnitude of the instant input signal is built up when the second sampling periods are brought into the further predetermined frequency and phase relationship with the input signal.

15. An electrical circuit as claimed in claim 14, wherein said integrating storage means comprises a resistor and first and second capacitors to which the second switching signals are applied alternately.

16. An electrical circuit as claimed in claim 1, further including a comparator and wherein said second sampling means comprises a resistor, two capacitors, and switch means through which the instant input signal is applied alternately to respective capacitors, each of said capacitors being connected to a respective input of said comparator, said comparator providing an output signal representing detection of an input signal when the difference between charges on said capacitors and hence the voltages applied to said comparator, exceeds a predetermined value and has a predetermined sign.

17. An electrical circuit as claimed in claim 16, including a counter connected to an output of said comparator, output of said counter assuming a predetermined condition representing detection of an input signal only when an output signal from the comparator has been maintained for a predetermined number of sampling periods.

18. An electrical circuit as claimed in claim 17, further including further switch means provided between said capacitors and said comparator, said further switch means being operated by an output voltage from said counter for effecting a reduction in predetermined magnitude of voltage below which voltage from said capacitors must fall before an output signal from said comparator is terminated.

19. An electrical circuit as claimed in claim 1, wherein said oscillator means comprises oscillator means for establishing initially a frequency of the first sampling periods equal to twice the frequency within the predetermined range and variable over a range whose upper and lower frequencies are respectively equal to twice the upper and lower frequencies of the predetermined range, each of the first sampling periods extending over an interval of time which, when the frequency of the first sampling periods has been changed to a value equal to twice the frequency of the instant input signal, equals one third of a cycle of the input signal and is substantially centered on a point on the input signal which has zero slope and each of the second sampling periods extends over an interval of time equal to one sixth of a cycle of the instant input signal and occupies the time between successive first sampling periods.

* * * * *